(12) United States Patent
Schmidt et al.

(10) Patent No.: US 9,814,149 B2
(45) Date of Patent: *Nov. 7, 2017

(54) SMART-HOME DEVICE BATTERY COMPARTMENT FACILITATING EASE OF USER ACCESS AND DEVICE ROBUSTNESS

(71) Applicant: Google Inc., Mountain View, CA (US)

(72) Inventors: Mathias Schmidt, Emeryville, CA (US); William Dong, Palo Alto, CA (US); Adam Mittleman, Redwood City, CA (US)

(73) Assignee: Google Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/403,698

(22) Filed: Jan. 11, 2017

(65) Prior Publication Data

US 2017/0127542 A1    May 4, 2017

Related U.S. Application Data

(63) Continuation of application No. 14/713,937, filed on May 15, 2015, now Pat. No. 9,609,766.

(51) Int. Cl.
| | | |
|---|---|---|
| *G08B 21/00* | (2006.01) | |
| *H05K 5/02* | (2006.01) | |
| *G08B 17/113* | (2006.01) | |

(52) U.S. Cl.
CPC ......... *H05K 5/0239* (2013.01); *G08B 17/113* (2013.01); *H05K 5/0226* (2013.01)

(58) Field of Classification Search
CPC .................................................... H05K 5/0086
USPC .............................. 340/628, 629, 630, 693.5
See application file for complete search history.

(56) References Cited

U.S. PATENT DOCUMENTS

| | | | |
|---|---|---|---|
| 7,205,901 B2 | 4/2007 | Demster | |
| 8,847,772 B2 | 9/2014 | Marks et al. | |

*Primary Examiner* — Jeffery Hofsass
(74) *Attorney, Agent, or Firm* — Kilpatrick Townsend & Stockton LLP

(57) ABSTRACT

According to one embodiment, an access door for a hazard detector includes a release member that releasably secures the access door in a closed position over a battery compartment of the hazard detector. The release member allows the access door to be pivoted open and closed relative to the battery compartment and hazard detector. The access door also includes a first hinge member and a second hinge member. The first hinge member enables the access door to pivot along a first pivot path and by a first pivot amount and the second hinge member enables the access door to pivot along a second pivot path and by a second pivot amount. A cumulative total of the first pivot amount and the second pivot amount is substantially greater than either pivot amount alone.

20 Claims, 13 Drawing Sheets

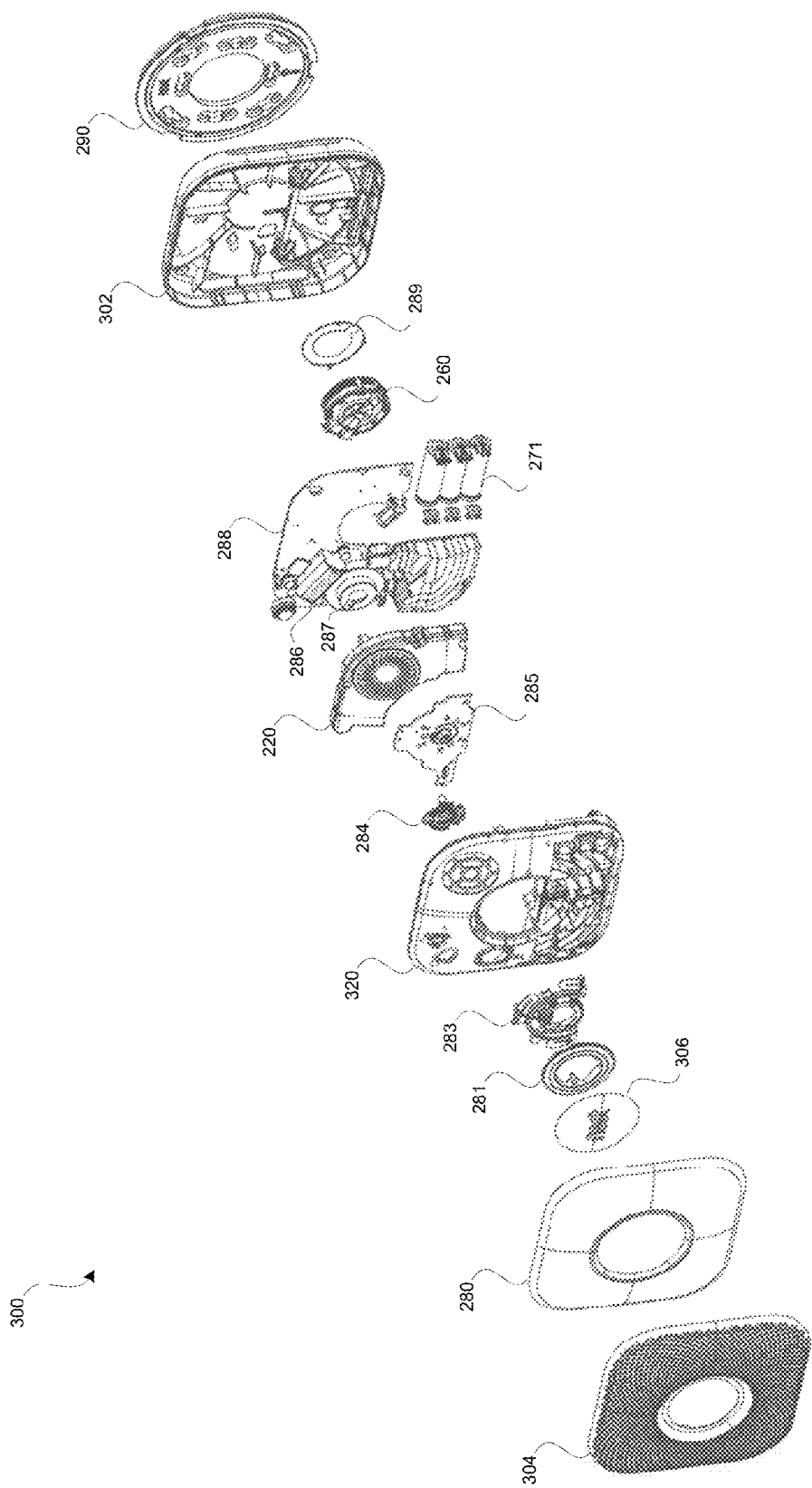

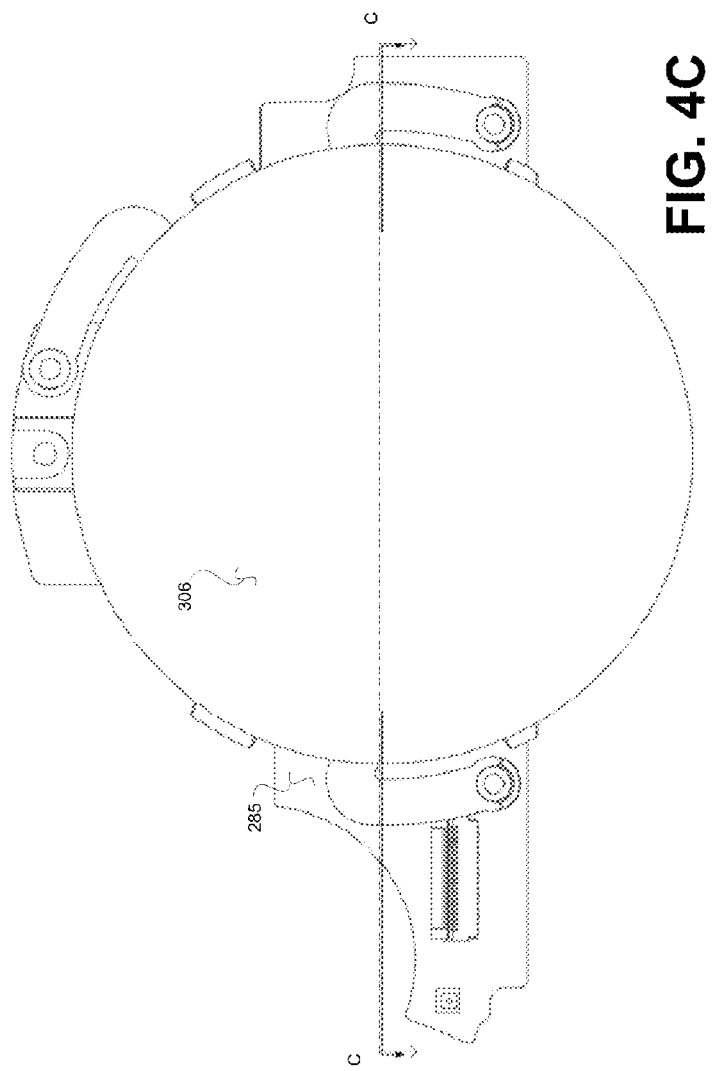
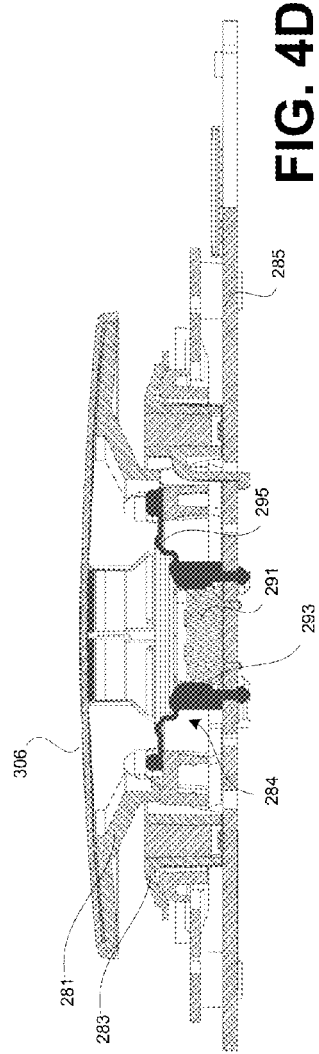
FIG. 4C
FIG. 4D

SMART-HOME DEVICE BATTERY COMPARTMENT FACILITATING EASE OF USER ACCESS AND DEVICE ROBUSTNESS

CROSS-REFERENCE TO RELATED APPLICATIONS

This patent application is a continuation and claims the benefit of the filing date of U.S. patent application Ser. No. 14/713,937 filed May 15, 2015, which is incorporated by reference herein.

BACKGROUND OF THE INVENTION

Homes, buildings, and other structures are required to utilize hazard detectors that detect the presence of a hazard with the home, building, or structure and that alert an occupant to a potential danger. Such hazard detectors often include battery compartments that house batteries that provide a main or supplemental power to the hazard detector. Some hazard detectors include access ports that allow a user to access the battery compartment for various reasons, such as inspection or replacement of the batteries. Because access to the batteries is often desired or required, the access ports should be easy to use to avoid discouraging a user from a required or encouraged inspection or replacement of the batteries.

BRIEF SUMMARY OF THE INVENTION

Embodiments of the invention provide hazard detection devices that may be used within a home, building, or structure to warn occupants of the home, building, or structure of a potential danger. In one aspect, a hazard detector includes a housing having an interior region within which components of the hazard detector are contained. The housing includes a plurality of openings through which air flows so as to be accessible to a hazard sensor positioned within the interior region of the housing. The hazard detector also includes a battery compartment that is configured to house one or more batteries that provide a main power or supplemental power to one or more components of the hazard detector. The hazard detector further includes a battery compartment access door that is pivotably coupled with a bottom surface of the housing. The access door is pivotably closable over the battery compartment to secure the one or more batteries within the battery compartment and is pivotably openable to allow user access to the one or more batteries positioned within the battery compartment for inspection, replacement, and the like.

The access door includes a release member that releasably secures the access door in a closed position relative to the housing and that is releasable to allow the access door to be pivoted open. The access door also include a first hinge member and a second hinge member. The first hinge member pivotably couples the access door to the housing and enables the access door to pivot along a first pivot path by a first pivot amount or by a first rotational degree. The second hinge member enables the access door to pivot along a second pivot path by a second pivot amount or by a second rotational degree. A cumulative total of the first pivot amount and the second pivot amount is substantially greater than either pivot amount in isolation.

In some embodiments, the hazard detector additionally includes a spring that is coupled with the first hinge member. The spring is configured to bias the access door toward the open position such that operation of the release member effects automatic opening of the access door. In one embodiment, the spring is a torsional spring. In some embodiments, the hazard detector additionally includes an access door block that prevents closing of the access door when less than a full complement of batteries are positioned within the battery compartment. The access door block may be configured to pivot into the battery compartment when less than a full complement of batteries are positioned within the battery compartment. When a full complement of batteries is positioned within the battery compartment, the batteries function cooperatively to prevent the access door block from pivoting into the battery compartment. In some embodiments, the hazard detection additionally includes a stop that functions operationally with the first hinge member to limit the pivot of the access door to the first pivot amount. In some embodiments, the first pivot amount is between about 80° and 100° and the second pivot amount is between about 110° and 180°. In some embodiments, the access door includes one or more vanes that direct airflow from an exterior of the hazard detector to the interiorly positioned hazard sensor. In some embodiments, the battery compartment access door includes a recessed lip having a strip of material that presses into contact with the housing when closed the battery compartment access door is closed to seal any gaps between the battery compartment access door and the housing.

According to another aspect, a battery access door for a hazard detector is provided. The hazard detector includes a housing with a plurality of openings through which air flows so as to be accessible to a hazard sensor positioned within the interior region of the housing. The battery access door includes a release member, a first hinge member, and a second hinge member. The release member releasably secures the access door in a closed position over a battery compartment of the housing and is operable to allow the battery access door to be pivoted open to allow user access to the one or more batteries positioned within the battery compartment. The battery compartment is configured for housing one or more batteries that provide a main power or supplemental power to one or more components of the hazard detector. The first hinge member pivotably couples the battery access door to the housing and enables the battery access door to pivot along a first pivot path and to pivot a first pivot amount. The second hinge member enables the battery access door to pivot along a second pivot path and to pivot a second pivot amount. A cumulative total of the first pivot amount and the second pivot amount is substantially greater than either pivot amount in isolation.

In some embodiments, the battery access door also includes a spring that is coupled with the first hinge member. The spring is configured to bias the battery access door toward the open position so that operation of the release member effects automatic opening of the battery access door. The spring may be a torsional spring. In some embodiments, the hazard detector includes an access door block that prevents closing of the battery access door when less than a full complement of batteries are positioned within the battery compartment. In such embodiments, the access door block is configured to pivot into the battery compartment when less than the full complement of batteries is positioned within the battery compartment. The batteries function cooperatively to prevent the access door block from pivoting into the battery compartment when a full complement of batteries is positioned within the battery compartment. In some embodiments, the battery access door additionally includes a stop that functions operationally with the first hinge member to limit the pivot of the battery access door to the first pivot amount.

According to another aspect, a method of configuring a hazard detector is provided. The method includes providing a housing that includes an interior region within which components of the hazard detector are contained and includes a plurality of openings through which air flows so as to be accessible to a hazard sensor positioned within the interior region of the housing. The method also includes coupling a battery compartment with the housing. The battery compartment is configured for housing one or more batteries that provide a main power or supplemental power to one or more components of the hazard detector. The method further includes pivotally coupling a battery compartment access door with a bottom surface of the housing via a hinge component having a first pivot member and a second pivot member. The access door is pivotally closable over the battery compartment to secure the one or more batteries within the battery compartment and is pivotally openable to allow user access to the one or more batteries positioned within the battery compartment. The first pivot member enables the access door to pivot along a first pivot path by a first pivot amount and the second pivot member enables the access door to pivot along a second pivot path by a second pivot amount. A cumulative total of the first pivot amount and the second pivot amount is substantially greater than either pivot amount in isolation.

In some embodiments, the method includes coupling a spring with the hinge component, where the spring is configured to bias the access door toward the open position so that operation of a release member of the access door effects automatic opening of the access door. In some embodiments, the spring is a torsional spring. In some embodiments, the method includes coupling an access door block with the housing so that the access door block pivots into the battery compartment when less than a full complement of batteries is positioned within the battery compartment. When a full complement of batteries is positioned within the battery compartment, the batteries function cooperatively to prevent the access door block from pivoting into the battery compartment. In some embodiments, the hinge component may be operable with, or include, a stop that limits the pivot of the access door via the first pivot member to the first pivot amount. In some embodiments, the access door may include one or more vanes that direct airflow from an exterior of the hazard detector to the interiorly positioned hazard sensor.

BRIEF DESCRIPTION OF THE DRAWINGS

The present invention is described in conjunction with the appended figures:

FIGS. 2-4B illustrate various exploded perspective views of the hazard detector of FIGS. 1A-B.

FIGS. 4C and 4D illustrate an embodiment of components of a smart combined smoke detector and carbon monoxide device.

Figure 1A:
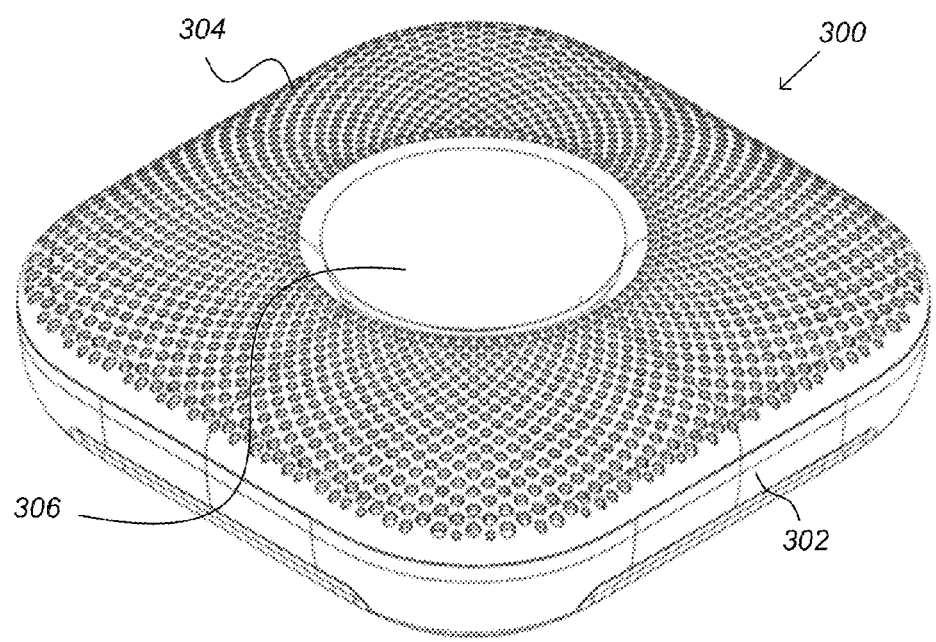
FIGS. 1A-B illustrate front and rear perspective views of a hazard detector that is configured for detecting the presence of the hazard within a building or structure.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION OF THE INVENTION

The ensuing description provides exemplary embodiments only, and is not intended to limit the scope, applicability or configuration of the disclosure. Rather, the ensuing description of the exemplary embodiments will provide those skilled in the art with an enabling description for implementing one or more exemplary embodiments. It being understood that various changes may be made in the function and arrangement of elements without departing from the spirit and scope of the invention as set forth in the appended claims.

An exemplary usage of the smart hazard detectors described herein is in detecting the presence of smoke within a building or structure and alerting occupants to the presence of smoke. Conventional hazard detectors often include a battery power source that either functions as a main power source for the hazard detector, or as a supplemental or backup power source that provides power to the hazard detector when a main power source is lost or otherwise interrupted. As with any device that is powered via batteries, the batteries typically need to be routinely inspected and/or changed, which requires user access to the battery compartment in which the batteries are housed or stored.

One aspect of the smart hazard detector described herein is the integration of an improved battery compartment and battery access door. The access door is pivotably positioned over the battery compartment so as to be pivotably opened and closed. The access door secures the batteries within the battery compartment when closed and allows the access door to be pivotably opened to enable user access to the batteries positioned within the battery compartment for inspection and/or replacement. The access door includes a release member and a plurality of hinges or pivot components that allow the door to be pivoted open. The release member is configured to releasably secure the access door in a closed position relative to the housing to secure the batteries within the battery compartment, and to allow the access door to be pivoted open so that the batteries are exposed and accessible to the user.

The hinges or pivot components include a first hinge member and a second hinge member. The first hinge member pivotably couples the access door to the housing and enables the access door to pivot along a first pivot path by a first pivot amount or rotational degree. The second hinge member enables the access door to pivot along a second pivot path by a second pivot amount or rotational degree. A cumulative total of the first pivot amount and the second pivot amount is substantially greater than either pivot amount in isolation. Stated differently, the use of two pivot members allows the access door to open to a far greater degree than would otherwise be achieved by using only one of the pivot members. This configuration helps prevent the access door from interfering with user access to the batteries and also aids in preventing breakage of the access door if the hazard detector is dropped or otherwise mishandled.

When the release member is actuated, the access door may be biased toward an open position via an internally positioned spring. In some embodiments, the spring may be a torsion spring that is positioned substantially flush with a bottom surface of the housing. The use of the torsion spring reduces the spring's "footprint" within the hazard detector device or, stated differently, minimizes the space that is required within the hazard detector to accommodate the spring. The housing may include channels or other cutout portions within which the spring is positioned.

The battery compartment includes an access door block that prevents the access door from being closed over the battery compartment when less than a full complement of batteries are positioned within the battery compartment. Stated differently, when one or more batteries are missing from the battery compartment, the access door block prevents the access door from being closed and secured over the batteries. This helps ensure that the hazard detector is not installed without a sufficient number of batteries to power the various components within the hazard device, such as a smoke chamber, carbon monoxide sensor, or other hazard sensor. As described in greater detail below, the access door block may be configured to pivot into the battery compartment when less than the full complement of batteries are positioned within the battery compartment. In such embodiments, when the full complement of batteries is positioned within the battery compartment, the batteries may function cooperatively to prevent the access door block from pivoting into the battery compartment.

For overall understanding, a big picture view of a hazard detector or device is first described. Such a device may be a dedicated smoke detector or a combination device, such as carbon-monoxide detector and smoke detector. FIG. 1A illustrates an embodiment of a smart combined smoke detector and carbon monoxide device or hazard detector 300 (hereinafter hazard detector or smart hazard detector 300). Such an embodiment of a smart hazard detector 300 may be suitable for mounting to a wall or ceiling in a room (or other location) within a structure in which smoke and/or carbon monoxide is to be monitored. Hazard detector 300 may be "smart," meaning the device 300 can communicate, likely wirelessly, with one or more other devices or networks. For instance, hazard detector 300 may communicate with a remote server via the Internet and, possibly, a home wireless network (e.g., an IEEE 802.11a/b/g network, 802.15 network, such as using the Zigbee® or Z-Wave® specification). Such a smart device may allow for a user to interact with the device via wireless communication, either via a direct or network connection between a computerized device (e.g., cellular phone, tablet computer, laptop computer, or desktop computer) and the smart device.

FIG. 1A illustrates an angular top projection view of the hazard detector 300. Hazard detector 300 may generally be square or rectangular and have rounded corners. Visible in the angular top projection view are various components of the hazard detector 300, including: cover grille 304, lens/button 306, and enclosure or housing 302 (also referred to as sensor housing). Cover grille 304 may serve to allow air to enter the hazard detector 300 through many holes while giving the hazard detector 300 a pleasing aesthetic appearance. Cover grille 304 may further serve to reflect light into the external environment of hazard detector 300 from internal light sources (e.g., LEDs). Light may be routed internally to cover grille 304 by a light pipe, noted in relation to FIGS. 2-4A. It should be understood that the arrangement of holes and shape of cover grille 304 may be varied by embodiment. Lens/button 306 may serve multiple purposes. First, lens/button 306 may function as a lens, such as a Fresnel lens, for use by a sensor, such as an infrared (IR) sensor, located within hazard detector 300 behind lens/button 306 for viewing the external environment of hazard detector 300. Additionally, lens/button 306 may be actuated by a user by pushing lens/button 306. Such actuation may serve as user input to hazard detector 300. Enclosure/housing 302 may serve as a housing for at least some of the components of hazard detector 300.

Figure 1B:
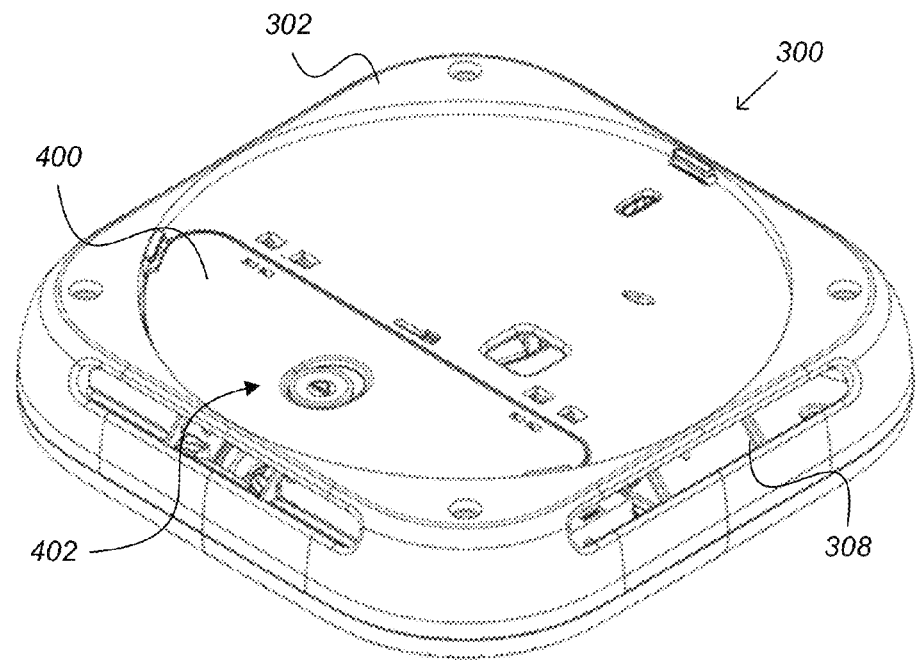

FIG. 1B illustrates an angular bottom projection view of a hazard detector 300. Visible from this view is a portion of enclosure/housing 302. On enclosure/housing 302, battery compartment door 400 is present through which a battery compartment is accessible. Also visible are airflow vents 308, which allow air to pass through enclosure/housing 302 and enter the hazard detector 300. The battery access door 400 covers and secures batteries (not shown) positioned within a battery compartment (not shown). The battery access door 400 may include a releasable member 402, such as a slidable or pivotable button, that allows the battery access door 400 to be opened to expose the internally positioned batteries. The housing 302 may also include slots or vents 308 through which air or other gas flows into the interior of the housing 302.

Figure 2:
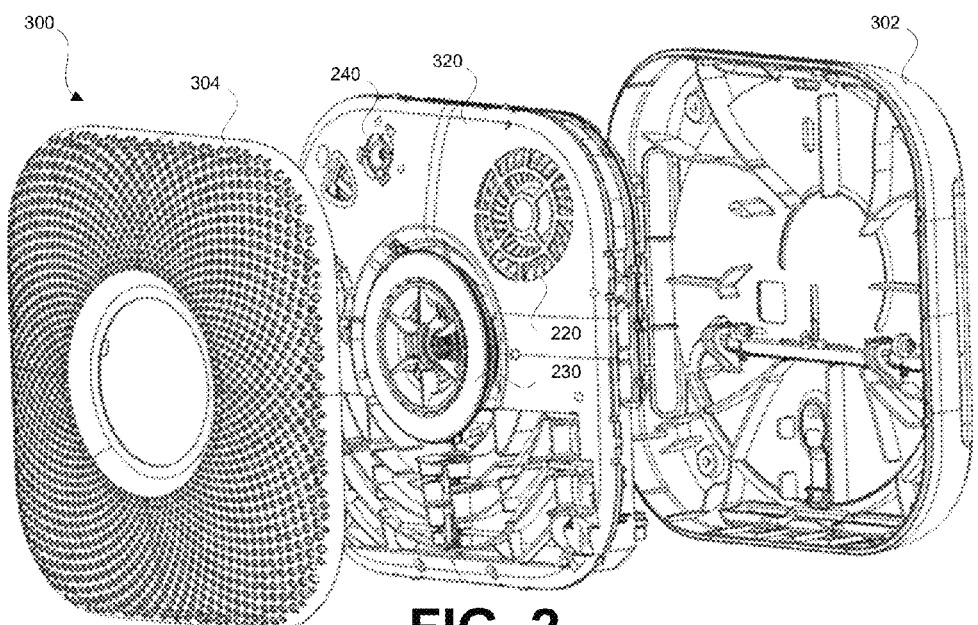
Figure 3:
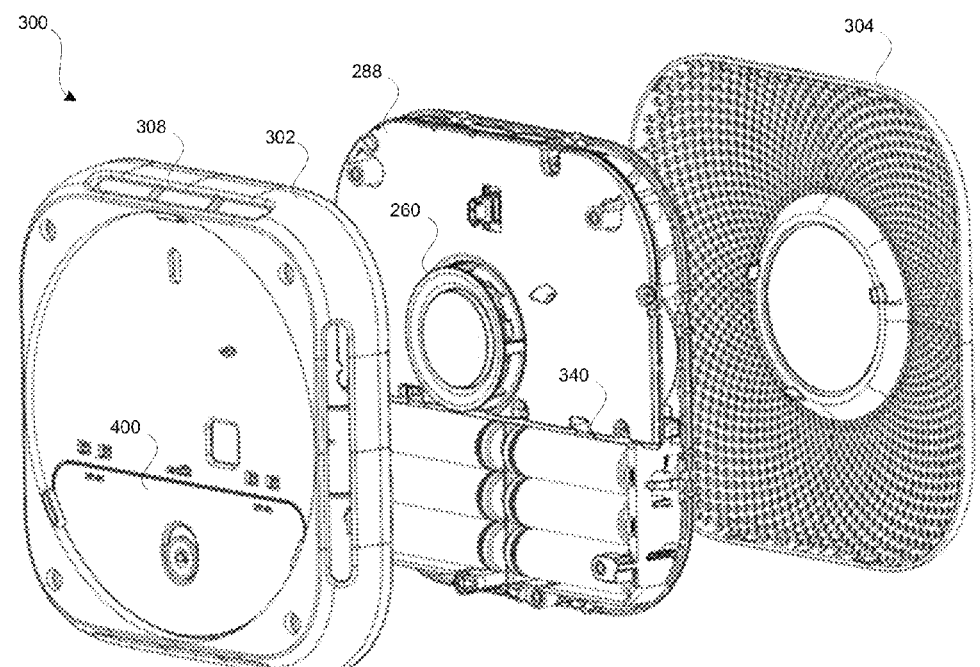

FIGS. 2-4A illustrate an embodiment of an exploded hazard detector. The devices of FIGS. 2-4A can be understood as representing various views of the hazard detector 300 of FIGS. 1A and 1B. In FIG. 2, hazard detector 300 is shown having cover grille 304 and enclosure/housing 302, which together house main chassis 320. Main chassis 320 may house various components that can be present in various embodiments of hazard detector 300, including speaker 220, light pipe 230, and microphone 240. FIG. 3 illustrates the hazard detector 300 from a different viewpoint. In FIG. 3, cover grille 304, enclosure/housing 302, airflow vent 308, and battery compartment door 400 are visible. A gap may be present between enclosure/housing 302 and main circuit board 288 to allow airflow through airflow vents 308 to have a relatively unobstructed path to enter and exit smoke chamber 260. In some embodiments, the main circuit board 288 includes one or more laminar flow covers disposed over some or all components to help with even, laminar airflow within the device and to prevent a user from accidentally touching an ESD sensitive component. Also present in FIG. 3 are multiple batteries, which are installed within battery compartment 340 of hazard detector 300 and which are accessible via battery compartment door 400.

FIG. 4A represents a more comprehensive exploded view of the hazard detector 300. Hazard detector 300 includes: cover grille 304, mesh 280, lens/button 306, light pipe 281, button flexure 283, main chassis 320, diaphragm 284, passive infrared (PIR) and light emitting diode (LED) daughterboard 285, speaker 220, batteries 271, carbon monoxide (CO) sensor 286, buzzer 287, main circuit board 288, smoke chamber 260, chamber shield 289, enclosure/housing 302, and surface mount plate 290. In some embodiments, the cover grille 304 and/or mesh 280 may help admit CO to the interior of the device where the CO sensor 286 is located. It should be understood that alternate embodiments of hazard detector 300 may include a greater number of components or fewer components than presented in FIG. 4A.

A brief description of the above noted components that have yet to be described follows: Mesh 280 sits behind cover grille 304 to obscure external visibility of the underlying components of hazard detector 300 while allowing for airflow through mesh 280. Light pipe 281 serves to direct light generated by lights (e.g., LEDs such as the LEDs present on daughterboard 285) to the external environment of hazard detector 300 by reflecting off of a portion of cover grille 304. Button flexure 283 serves to allow a near-constant pressure to be placed by a user on various locations on lens/button 306 to cause actuation. Button flexure 283 may cause an actuation sensor located off-center from lens/button 306 to actuate in response to user-induced pressure on lens/button 306. Diaphragm 284 may help isolate the PIR sensor on daughterboard 285 from dust, bugs, and other matter that may affect performance. Daughterboard 285 may have multiple lights (e.g., LEDS) and a PIR (or other form of sensor). Daughterboard 285 may be in communication with components located on main circuit board 288. The PIR sensor or other form of sensor on daughterboard 285 may sense the external environment of hazard detector 300 through lens/button 306.

Buzzer 287, which may be activated to make noise in case of an emergency (and when testing emergency functionality), and carbon monoxide sensor 286 may be located on main circuit board 288. Main circuit board 288 may interface with one or more batteries 271, which serve as either the primary source of power for the device or as a backup source of power if another source, such as power received via a wire from the grid, is unavailable. Protruding through main circuit board may be smoke chamber 260, such that air (including smoke if present in the external environment) passing into enclosure/housing 302 is likely to enter smoke chamber 260. Smoke chamber 260 may be capped by chamber shield 289, which may be conductive (e.g., metallic). Smoke chamber 260 may be encircled by a conductive (e.g., metallic) mesh (not pictured). Enclosure/housing 302 may be attached and detached from surface mount plate 290. Surface mount plate 290 may be configured to be attached via one or more attachment mechanism (e.g., screws or nails) to a surface, such as a wall or ceiling, to remain in a fixed position. Enclosure/housing 302 may be attached to surface mount plate 290 and rotated to a desired orientation (e.g., for aesthetic reasons). For instance, enclosure/housing 302 may be rotated such that a side of enclosure/housing 302 is parallel to an edge of where a wall meets the ceiling in the room in which hazard detector 300 is installed.

Figure 4B:
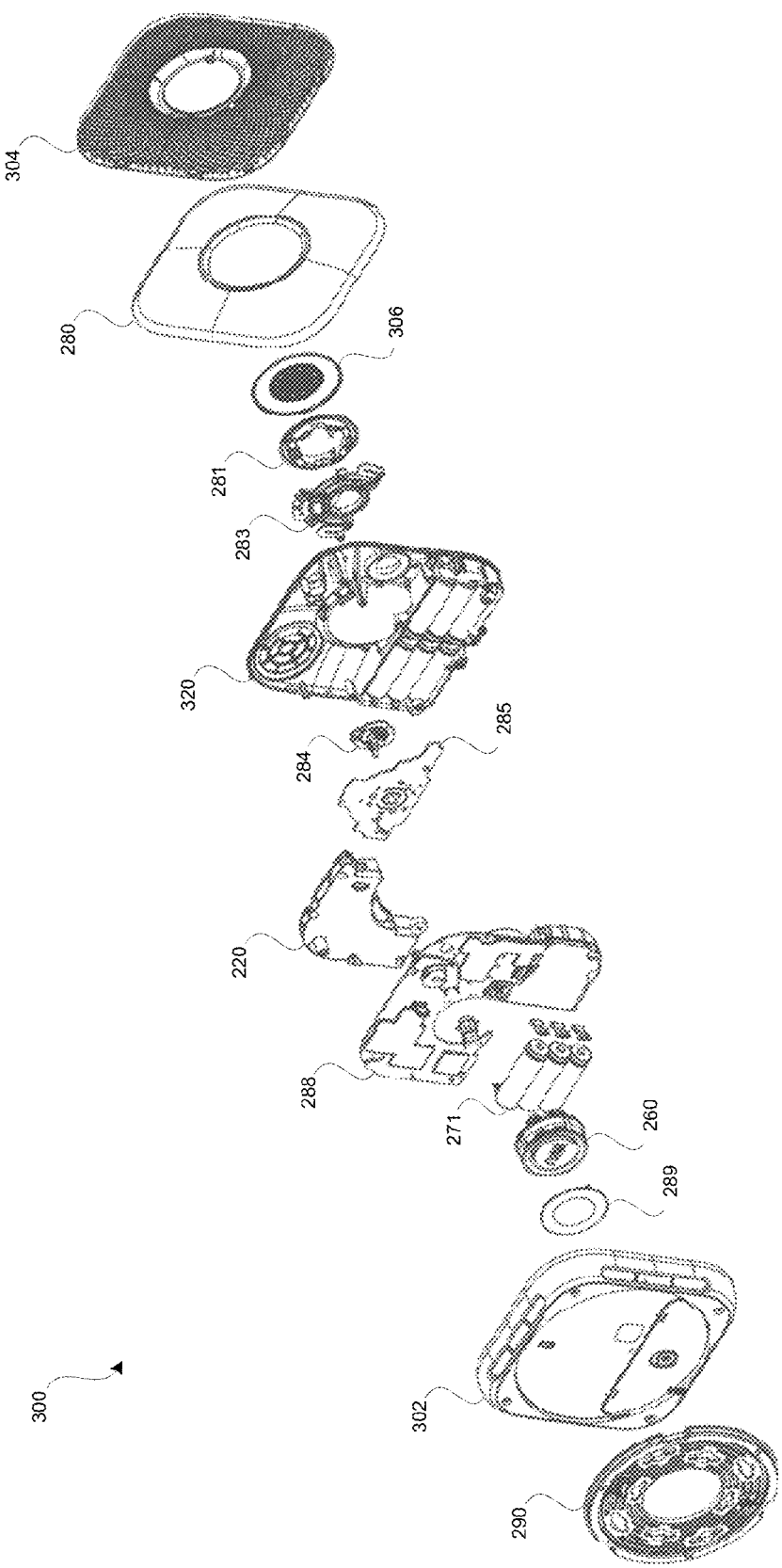

FIG. 4B represents the comprehensive exploded view of the hazard detector 300 of FIG. 4A viewed from a reverse angle as presented in FIG. 4A. Hazard detector 300 includes: cover grille 304, mesh 280, lens/button 306, light pipe 281, button flexure 283, main chassis 320, diaphragm 284, passive infrared (PIR) and light emitting diode (LED) daughterboard 285, batteries 271, speaker 220, carbon monoxide (CO) sensor 286 (not visible), buzzer 287 (not visible), main circuit board 288, smoke chamber 260, chamber shield 289, enclosure/housing 302, and surface mount plate 290. It should be understood that alternate embodiments of hazard detector 300 may include a greater number of components or fewer components than presented in FIG. 4A.

Figure 5A:
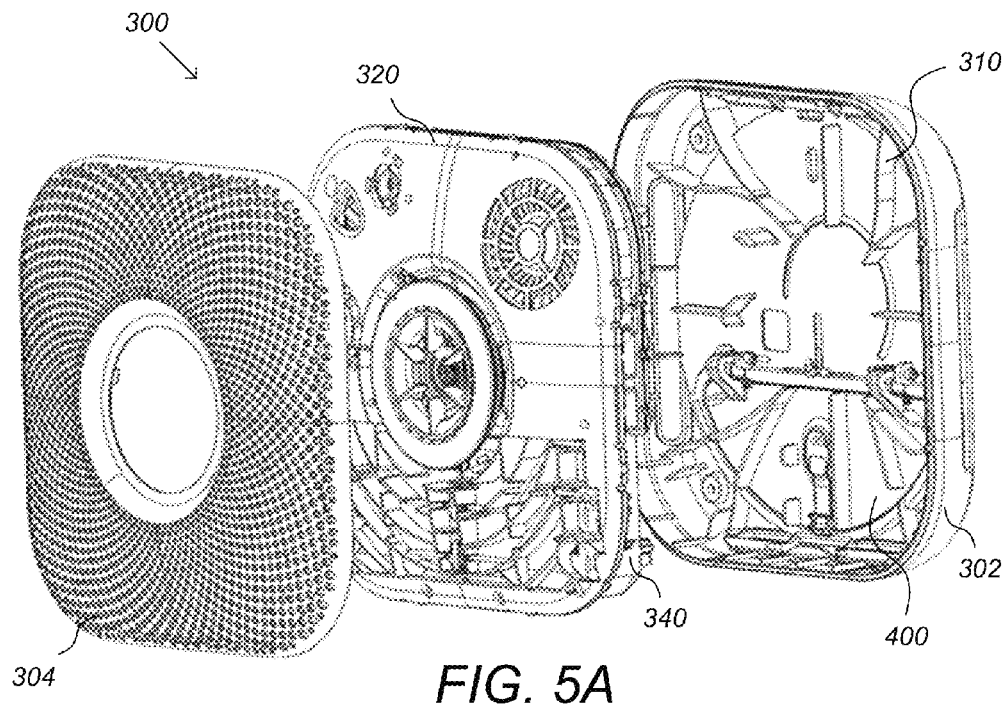
FIGS. 5A-B illustrate front and rear exploded perspective views of the hazard detector of FIGS. 1A-B.
Figure 5B:
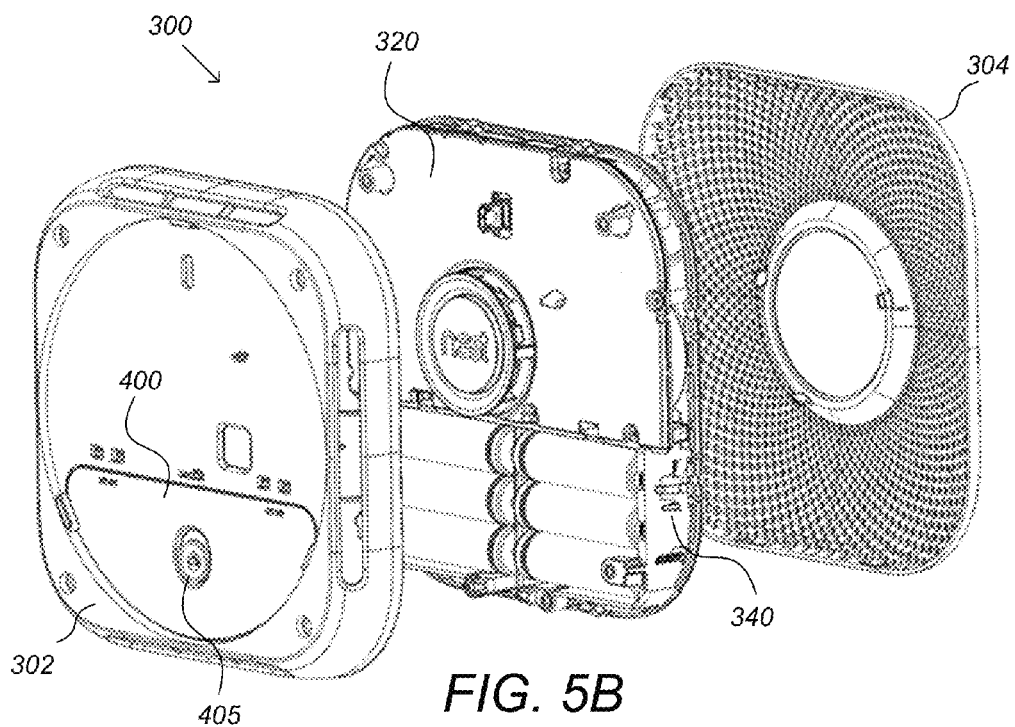

FIG. 4C shows a top view of an embodiment of some components of a smart combined smoke detector and carbon monoxide device, and FIG. 4D is a cross-sectional view of those components taken along cutting-plane line C-C of FIG. 4C. One of the illustrated components is gasket 284. In some embodiments, gasket 284 physically and thermally isolates PIR sensor 291 by providing thermal-resistant barrier around heat-sensitive PIR sensor 291, thereby limiting heat transfer from LEDs via radiation and/or convection. In some embodiments, gasket 284 is disposed between support lens/button 306 and PCB 285, and at least partially encloses PIR sensor 291. In some embodiments, gasket 284 includes sleeve 293 and flange 295. Sleeve 293 slides tightly over and surrounds at least a portion of outer periphery of a body portion of PIR sensor 291, thereby providing a thermal-isolation barrier at least partially around PIR sensor 291. In some embodiments, 295 flange is a flexible diaphragm that flexes and deforms to allow actuation of button/lens 306, while enabling sleeve 293 to maintain a seal around PIR sensor 291. In some embodiments, gasket 284 is made of a silicone rubber sleeve Referring now to FIGS. 5A and 5B, illustrated are front and rear exploded perspective views of several components of the hazard detector 300. FIGS. 5A and 5B illustrate the hazard detectors cover grille 304 that is positioned in front of and securable to the housing 302. The figures also illustrate the main chassis 320 that is disposed between the cover grille 304 and the bottom of the housing 302. The main chassis 320 is positioned within the interior of the hazard detector 300 when the cover grille 304 is attached to the housing 302. In many embodiments, the main chassis 320 is configured to attach to the inner portion of the cover grille 304 via engagement between snap or interlocking components of the main chassis 320 and cover grille 304. The main chassis 320 may include a centrally located aperture or hole through which one or more components of the hazard detector 300 are positioned, such as a proximity sensor (not shown) and/or a switch (not shown). The main chassis 320 may include one or more additional apertures or other features that mount and/or operationally coupled with various other components of the hazard detector 300. The housing 302 typically includes one or more vanes 310 that direct airflow from an exterior of the hazard detector to the interiorly positioned hazard sensor, such as a smoke chamber. The battery access door 400 also typically includes one or more vanes 310 that direct airflow from an exterior of the hazard detector to the interiorly positioned hazard sensor. In some embodiments, the vanes 310 of the battery access door 400 and/or housing 302 may be arranged to funnel or flow air to a hazard sensor that is positioned off-axis from a central axis or location of the hazard detector 300.

The battery compartment 340 is positioned on a rear lower portion of the main chassis 320. When coupled with the housing 302, the battery compartment 340 is positioned directly adjacent and axially above the battery access door 400 so that opening of the battery access door 400 exposes batteries positioned within the battery compartment 340. The main chassis 320 may include one or more threaded bosses that enable the main chassis 320 to be attached or coupled with the housing 302 via screws or other mechanical fasteners. In other embodiments, the main chassis 320 may be coupled with the cover grille 304 and/or housing 302 via the use of adhesives, heat welding, sonic or RF welding, and the like.

Figure 6A:
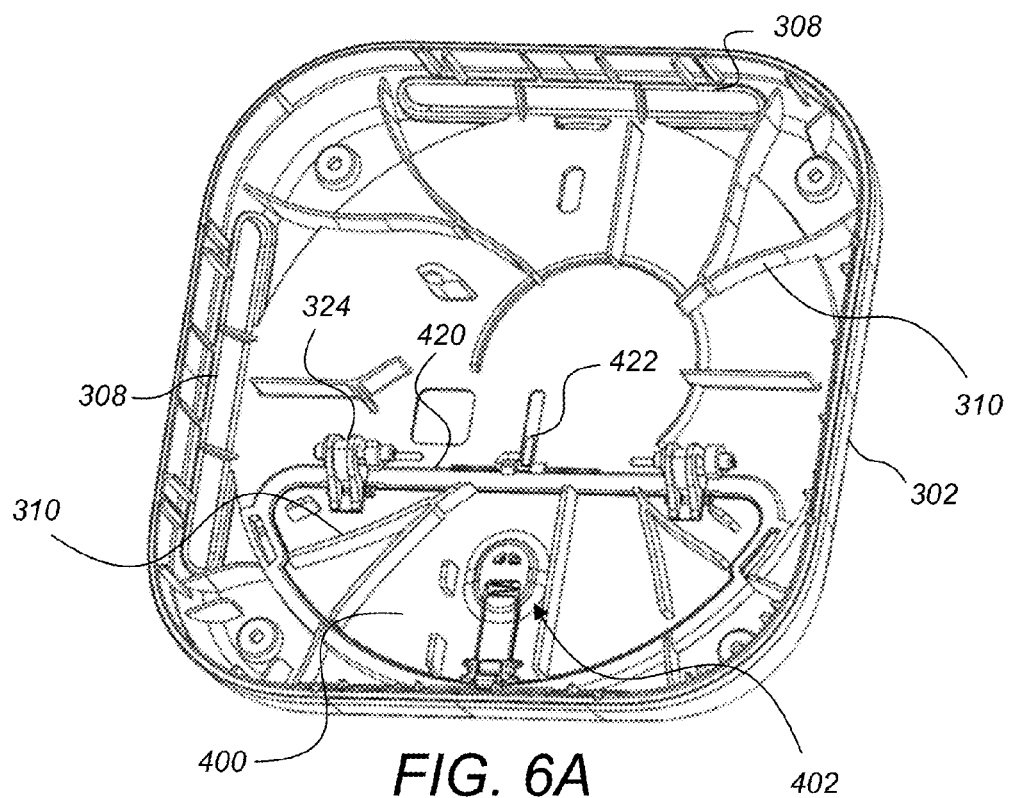
FIGS. 6A-B illustrate front and rear perspective views of a housing component of the hazard detector of FIGS. 1A-B.
Figure 6B:
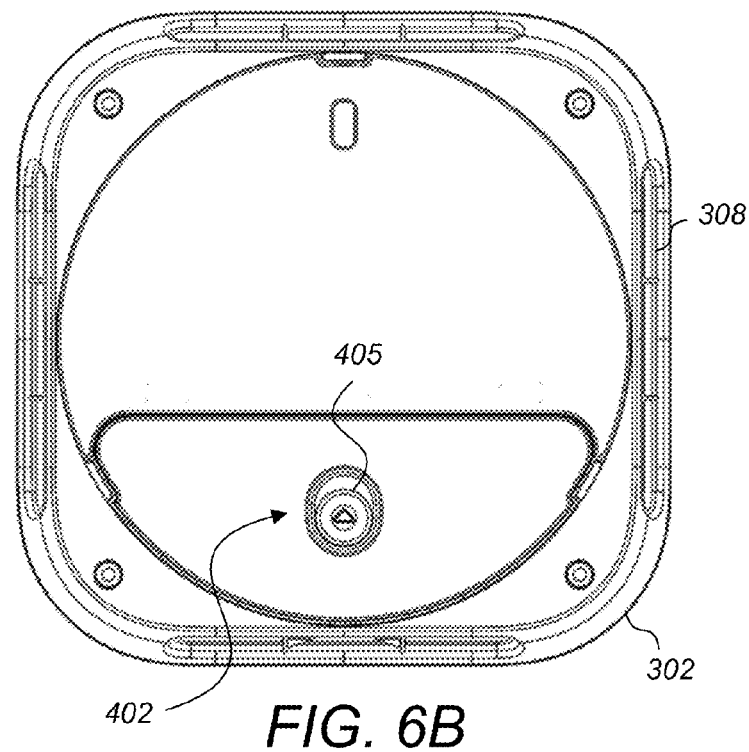

FIGS. 6A-7G provide a more detailed illustration of the battery access door 400 of hazard detector 300. FIGS. 6A and 6B illustrate front and rear perspective views of the housing 302 with the battery access door 400 in a closed position. As shown in FIG. 6A, the battery access door 400 is pivotally coupled with the housing 302 via a hinge component 324. The hinge component 324 includes a relatively linear or straight rear portion 328 and an arcuate, curved, or sloped front portion 326 such that overall side profile of the hinge component is c-shaped or n-shaped. The hinged component 324 is also coupled with a torsion bar spring 420 that is pre-tensioned to bias the battery access door 400 towards an open position when the release mechanism 402 is operated or actuated by a user. A central portion of the torsion bar spring 420 is positioned within a groove or recess 432 of housing 302. Positioning the torsion bar spring 420 within the recess 432 of housing 302 enables the torsion bar spring 420 to maintain a flat or low profile within the housing 302. Stated differently, positioning the torsion bar spring 420 within the housing 302 in this manner minimizes the housing's interior space that is necessary to accommodate the torsion bar spring 420 because the torsion bar spring 420 does not protrude or otherwise extend into the interior space of the housing 302.

Figure 7A:
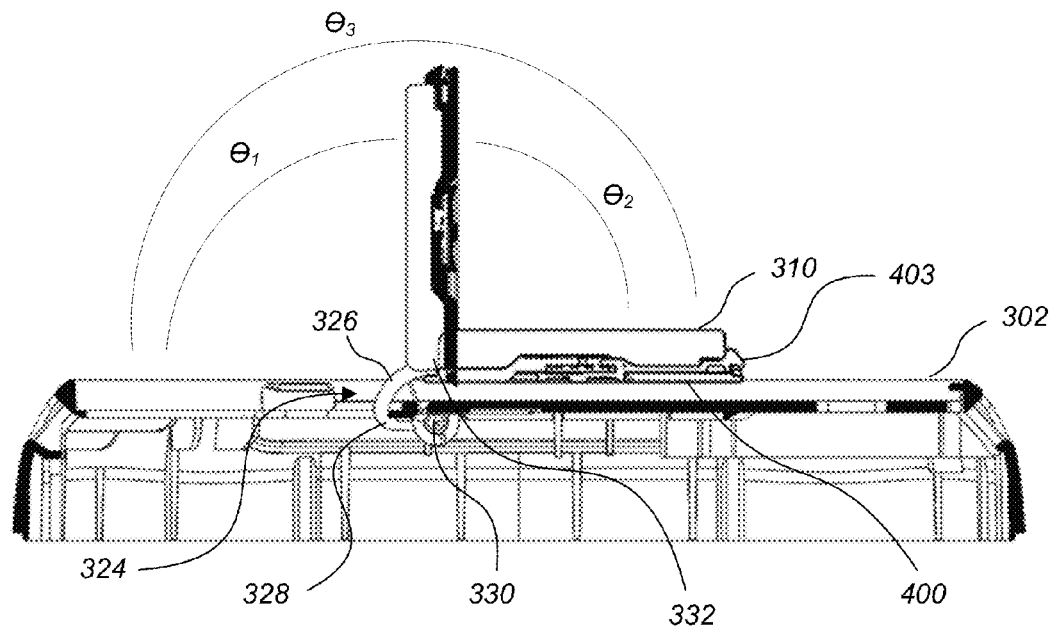
FIGS. 7A-D illustrate various views of a battery access door, spring, and hinge component of the hazard detector of FIGS. 1A-B.
Figure 7B:
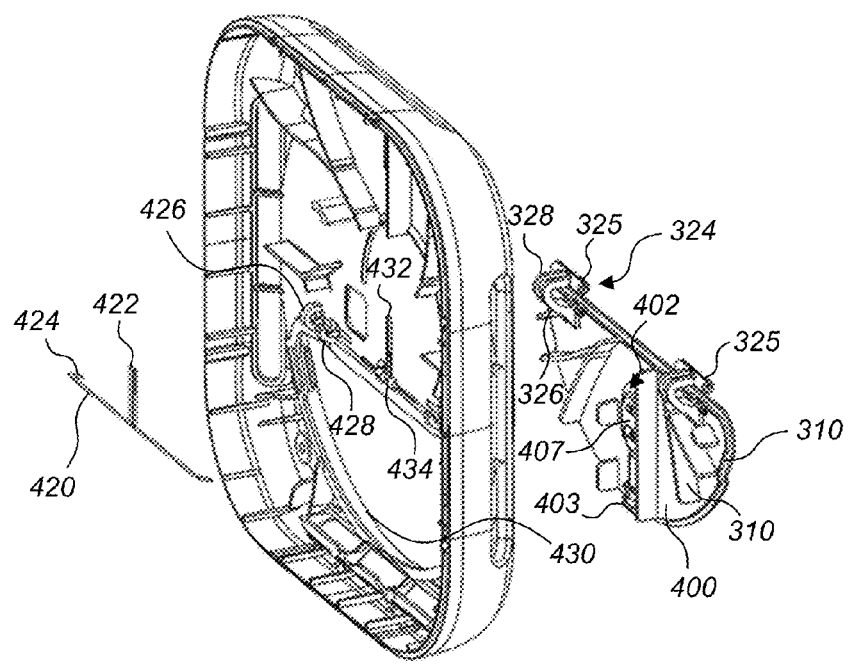

As illustrated in greater detail in FIG. 7B, the torsion bar spring 420 includes a U-shaped central portion 422 and two laterally extending arms that extend in opposite directions from the U-shaped central portion 422. A finger or protrusion 424 extends roughly orthogonally from a distal end of each laterally extending arms. When combined with the housing 302, the U-shaped central portion 422 of the torsion bar 420 is positioned within the corresponding U-shaped recess or channel 432 of housing 302. The U-shaped central portion 422 of torsion bar 420 prevents the torsion bar 420 from rotating within a recess or channel 432 of the housing 302 when torque or a moment force is applied to the torsion bar spring 420 via fingers 424, such as when the battery access door 400 is rotated into the closed position.

Positioned directly adjacent and on opposite sides of the U-shaped portion of recess or channel 432 are torsion bar spring guides 434 that secure and maintain the torsion bar spring 420 within the recessed or channel 432 of housing 302. One of the guides 434 may include an aperture or hole (not numbered) through which the finger or protrusion 424 and laterally extending arm are inserted. The other guide 434 may include a slot or channel (not numbered) within which the opposite laterally extending arms is inserted. In such embodiment, the torsion bar 420 may be coupled with the housing 302 by inserting one of the fingers or protrusions 424 and laterally extending arms through the guide 434 with the aperture or hole and then inserting or positioning the other laterally extending arms within the channel or slot of the other guide 434.

The inner surface of the housing 302 also includes retaining elements or members 426 and 428 that maintain and secure the battery access door 400 in a pivotal relationship with the housing 302. As with the guides 434, one of the retaining elements 426 includes a hole or aperture (not numbered) through which one end of a pivot rod 325 is inserted and the other retaining element 428 includes a slot or channel within which the opposite end of the pivot rod 325 is positioned. The configuration of the retaining elements 426 and 428 facilitate easy coupling of the battery access door 400 with the housing 302.

Figure 7C:
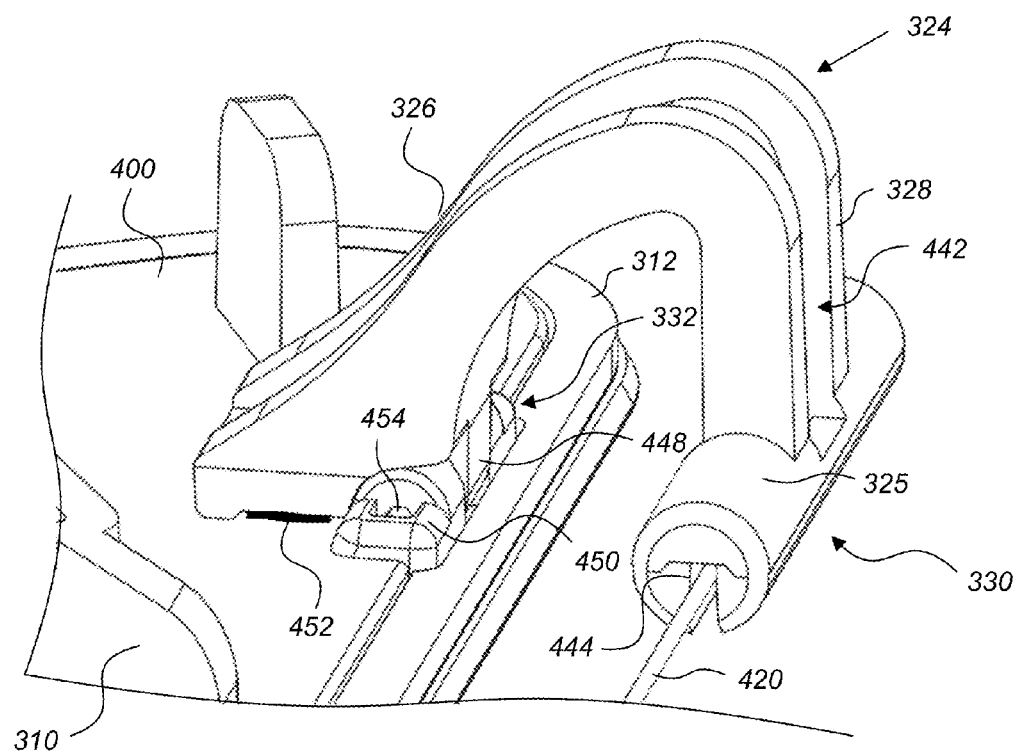
Figure 7D:
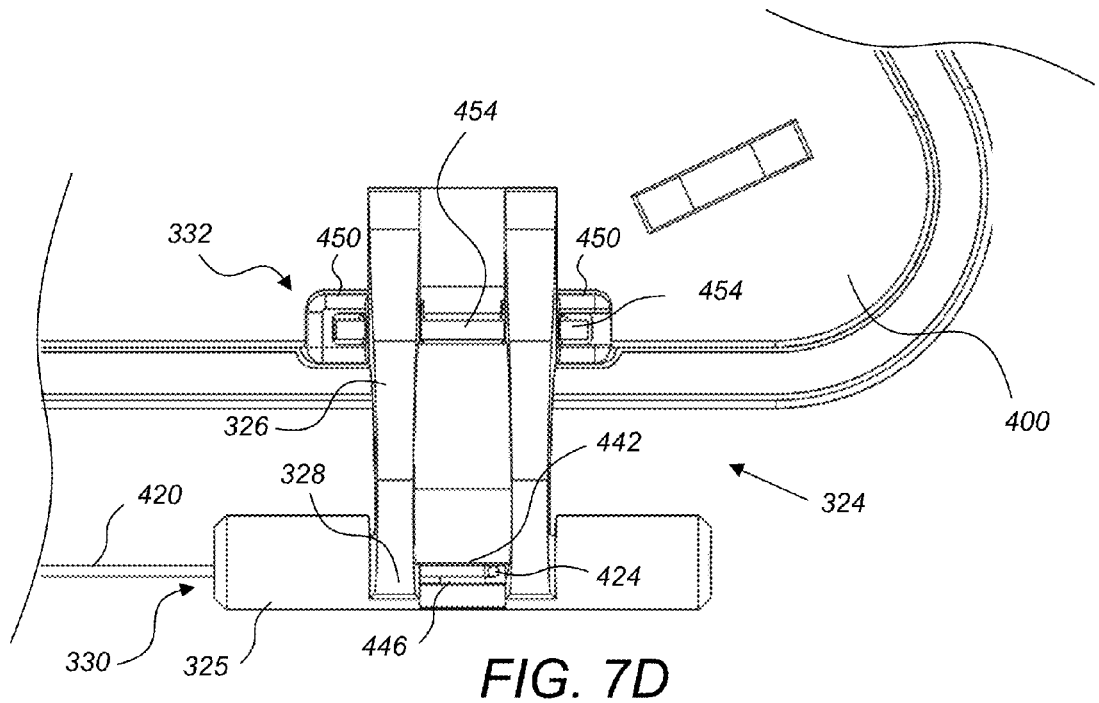

Referring now to FIGS. 7C and 7D, illustrated is the hinged component 324 of battery access door 400 in greater detail. FIGS. 7C and 7D illustrate one end of the pivot rod 325 of hinge component 324 positioned within the aperture of a retaining element 426 and the opposite end of the pivot rod 325 positioned within the slot or channel of the other retaining element 428. FIGS. 7C and 7D also illustrate the finger or protrusion 424 of the torsion bar spring 420 operationally coupled with the hinged component 324 of battery access door 400. Specifically, the laterally extending arm of the torsion bar spring 420 is positioned within a slot or channel 444 of the pivot rod 325. The finger or protrusion 424 extends upward through an access slot 446 of the pivot rod 325 and into contact with a surface 442 of the straight rear portion 328 of hinge component 324. As shown in FIGS. 7C and 7D, the straight rear portion 328 and sloped front portion 326 of hinge component 324 include lips or flanges that extend outward so that the surface 442 is slightly recessed. This configuration aids in maintaining the contact and coupling between the finger protrusion 424 and the surface 442 of the hinge component 324.

The torsion bar spring 420 may be coupled with the housing 302 and battery access door 400 by first coupling the torsion bar spring 420 with the housing 302 as described above and then by positioning the torsion bar spring's fingers/protrusions 424 and laterally extending arms within the slots, 444 and 446, of the pivot rod 325. In assembling the torsion bar spring 420 and battery access door 400, the torsion bar springs 420 may be torqued or pre-tensioned so that the torsion bar spring 420 biases the battery access door 400 toward an open configuration. As such, when the release member 402 is operated, the battery access door 400 may automatically pivot open. Exemplary materials and/or wire diameters for torsion bar spring 420 include music wire ASTM 228, 0.4-0.7 mm diameter. According to one embodiment, the torsion bar spring 420 may be pre-tensioned or torqued by rotating the fingers/protrusions 424 by between 60 and 80 degrees relative to the laterally extending arms.

The coupling between the pivot rod 325 and retaining elements, 426 and 428, define or establish a first pivot point or member 330 of the hinge component 324. A second pivot point or member 332 is also defined or established on the opposite end of the hinge component 324. Specifically, a distal end of the sloped front portion 326 is pivotally coupled with an inner surface of the battery access door 400. To couple a distal end of the sloped front portion 326 with the inner surface of the battery access door 400, a pin 454 is inserted through a hole or aperture of a pair of retaining element 450 of the battery access door 400 and through a hole or aperture of a retaining element 448 of the hinge component 324. The battery access door 400 pivots around the pin 454 and about the hinge component 324. As described above, the hinge component 324 is a double hinged member that enables pivoting of the battery access door 400 about the housing 302 and about the hinge component 324 itself.

A cushion or pad 452 is positioned between the inner surface of the battery access door 400 and the distal end of the sloped front portion 326. The pad 452 cushions the inner surface of the battery access door 400 when the battery access door is pivoted into the closed position. The pad 452 prevents sudden contact between the distal end of the sloped front portion 326 and the inner surface of the battery access door 400 and thereby prevents or reduces noise that would result from such contact.

The outer perimeter of the battery access door 400 includes a recessed lip that is positioned and rests within a corresponding recessed lip (not shown) of the housing's battery access opening 430 (see FIG. 7B). The recessed lips of the battery access door 400 and the housing's battery access opening 430 allow the battery access door 400 to lay approximately flat against the bottom surface of the housing 302 when the battery access door 400 is in the closed position. The recessed lip of the battery access door 400 includes a strip of material 312 that, when closed, presses into contact with and housing's recessed lip and seals any gaps that would otherwise exist between the battery access door 400 and the housing 302. In this manner, the battery access door 400 may be closed and secured in an air tight relationship with the housing 302. The air tight seal between the battery access door 400 and the housing 302 ensures that air flow is directed into the interior of the hazard detector 300 and not directed therefrom, which may occur in instances where a pressure differential exists between the front and rear surfaces of the hazard detector due to an electrical mounting box or for other reasons. Exemplary materials that may be used for the material strip 312 include urethane foam. In one embodiment, the material strip 312 may be between 1.12 mm and 1.52 mm wide and 0.79 mm and 0.89 mm thick.

Referring now to FIG. 7A, illustrated is the battery access door 400 in an a first and second open or pivot position. The battery access door 400 pivots, via the first pivot point or member 330, by an angle $\theta_1$ relative to the bottom surface of housing 302 to the first pivot position. In one embodiment, angle $\theta_1$ that is provided by first pivot point or member 330 may be between about 70° and 110°, more commonly between about 80° and 100°, and most often about 90°. The straight rear portion 328 of hinge component 324 may function as a stop to limit the pivoting of the battery access door 400 via or about the first pivot point or member 330. For example, the straight rear portion 328 may contact the inner surface of the housing member 302 when the battery access door 400 has pivoted or rotated an amount or angular degree equivalent to $\theta_1$. The pivot stop function of the straight rear portion 328 may prevent the torsion spring bar 420 from automatically opening the battery access door 400 too much or beyond a desired degree. The straight rear portion 328 and/or the inner surface of the housing 302 may include a cushion or pad (not shown) similar to pad 452 that prevents abrupt contact between the components and prevents or minimizes any noise. As shown in FIG. 7A, the battery access door 400 pivots to the first pivot position along or about a first pivot path. The first pivot path has a pivot arc or radius that is equivalent to the distance between the pivot rod 325 and an inner edge of the battery access door 400.

The battery access door 400 also pivots to the second pivot position, via the second pivot point or member 332, by an angle $\theta_2$ relative to the first pivot position of battery access door 400. As illustrated, the battery access door 400 rotates in the same angular direction from fully closed to the first pivot or open position and the second pivot or open position. In one embodiment, angle $\theta_2$ that is provided by second pivot point or member 332 may be between about 30° and 100°, most commonly between about 60° and 90°, and most often about 80°. In some embodiments, the material strip 312 may contact the distal end of the sloped front portion 326 to limit the pivoting of the battery access door 400 via or about the second pivot point or member 332. The material strip 312 may prevent or limit abrupt contact between the components and prevent or minimize any noise. In such embodiments, angle $\theta_2$ may be about 45°. The battery access door 400 pivots to the second pivot position along or about a second pivot path that is different than the first pivot path. The second pivot path is a pivot of the battery access door 400 directly about the pin 454 that couples the battery access door 400 and hinge component 324.

As illustrated in FIG. 7A, the pivot path provided by the first pivot member 330 is different than the pivot path provided by the second pivot member 332. Specifically, the first pivot member 300 effects a rotation of the hinge component 324 and the battery access door 400 while the second pivot member 332 effects a rotation of the battery access door 400 only (i.e., not a rotation of the hinge component 324. Accordingly, the first pivot or rotational path is a larger sweep of the battery access door 400 in comparison with the second pivot or rotational path. Stated differently, the battery access door's radius of rotation is greater when pivoting along the first pivot path than when pivoting along the second pivot path.

The double hinge configuration of hinge component 324 allows the battery access door to pivot open by a far greater amount or to a far greater degree than would be achieved via the use of first pivot point or member 330 or second pivot point or member 332 in isolation. For example, the use of the first pivot point or member 330 and the second pivot point or member 332 in combination enables the battery access door to pivot open by an angle $\theta_3$ relative to the bottom surface of the housing 302. Angle $\theta_3$ is a combination of angle $\theta_1$ and angle $\theta_2$ and may be between about 120° and 180°, although an angle of between about 150° and 180°, and preferable 180° is more common. The greater opening of the battery access door provides greater user access to the internally positioned batteries and/or prevents accidental breaking of the battery access door 400 if the hazard detector 300 is dropped or otherwise mishandled. For example, if the hazard detector 300 is dropped and the battery access door 400 contacts the ground, some of the impact energy will be transferred into rotation of the battery access door about the second pivot point or member 332 instead of being transferred to the hinge component 324 and/or its various members, which may break the hinge component 324 and/or its various members.

Figure 7E:
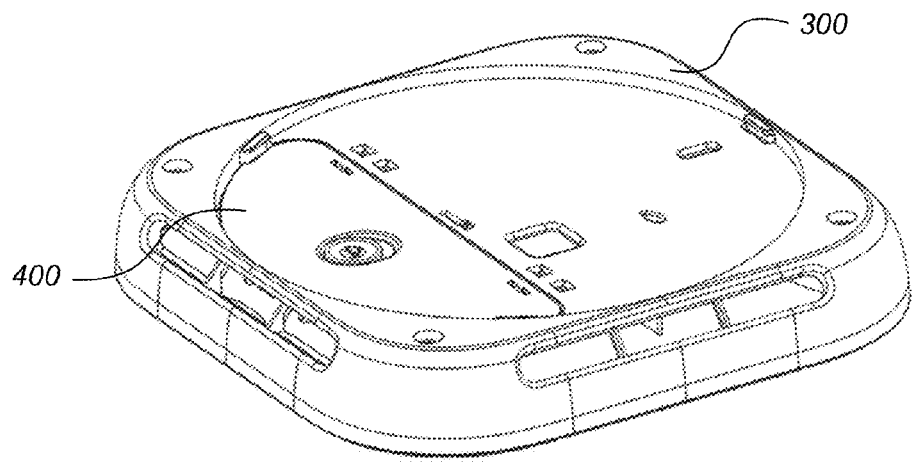
FIGS. 7E-G illustrate perspective views of the battery access door in a closed position and two open positions.
Figure 7F:
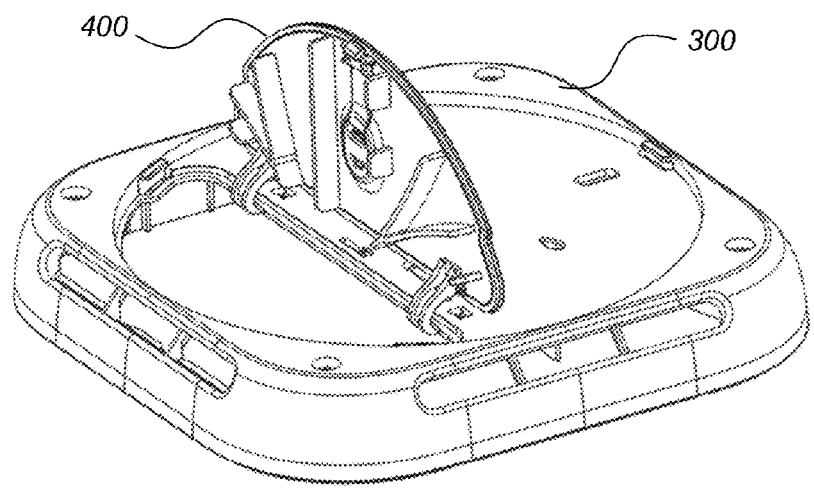
Figure 7G:
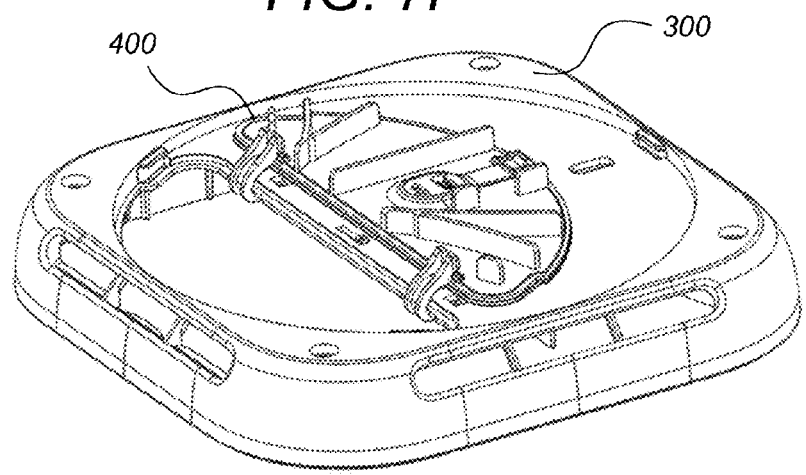

FIGS. 7E-G illustrate perspective views of the battery access door in the closed position and the two open positions. Specifically, FIG. 7E illustrates the battery access door 400 of hazard detector 300 in the closed position while FIG. 7F illustrates the battery access door 400 in the first pivot or open position relative to hazard detector 300 and FIG. 7G illustrates the battery access door 400 in the second pivot or open position relative to hazard detector 300. FIG. 7G illustrates the additional rotational motion achieved via the double hinge configuration of the battery access door 400. As illustrated, in some embodiments the battery access door 400 may lay fully flat against the housing 302 when in the second pivot or open position. In such embodiments, the battery access door 400 is capable of essentially 180° of rotation relative to the housing 302.

As briefly described above and illustrated in FIGS. 6B and 7B, the battery access door 400 includes a release member 402 that releasably closes and secures the battery access door 400 over the battery compartment 340. The release member includes a latch 403 that slides over and into contact with the inner surface of the housing's battery access opening 430 to secure the battery access door 400 closed. The top surface of the battery access door 400 includes a button member 405 that upon user actuation slides proximally and distally within an oval recess or groove (not numbered) to move the latch 403 into or out of contact with the inner surface of the housing's battery access opening 430 and thereby lock or release the access door 400 about the housing 302. The button member 405 is biased toward the closed and secured or locked position so that the battery access door 400 may be pivoted closed and automatically locked or secured about housing 302 and over battery compartment 340. The button member 405 includes ridges or a flanged perimeter that aids in transferring a user's force proximally and distally about battery access door 400 rather than downward toward the hazard detector's interior. An air flow block component 407 may be positioned on an inner surface of the battery access door 400 and axially below the button member 405 to prevent or limit air flow into or out of the hazard detector 300 via small openings in the release member 402.

Figure 8A:
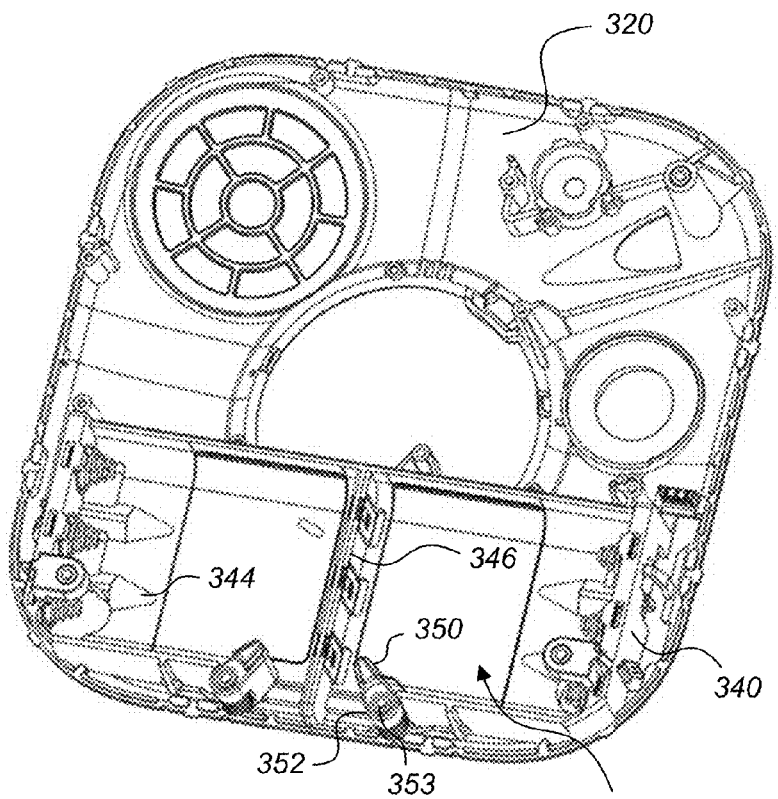
FIGS. 8A-C illustrate top views of a main chassis, battery compartment, and access door block component of the hazard detector of FIGS. 1A-B.
Figure 8B:
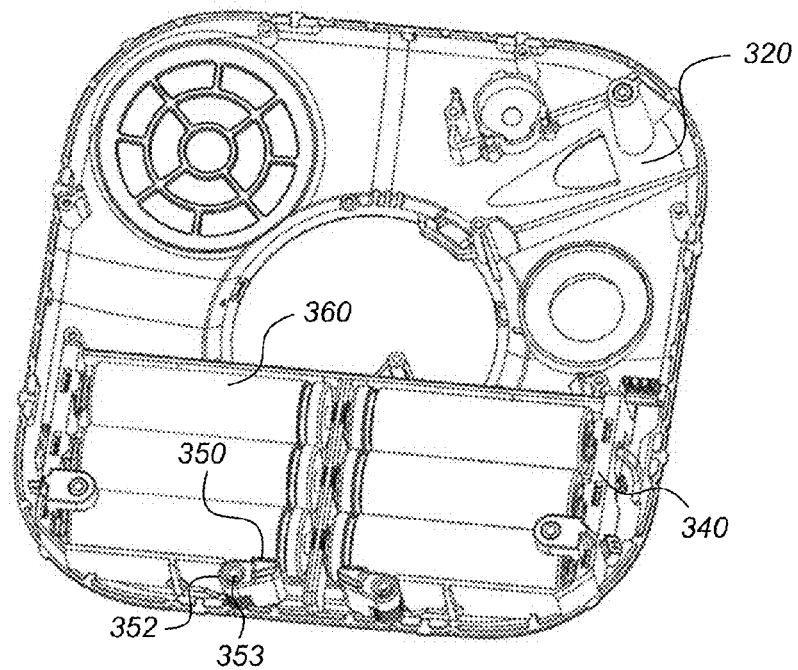
Figure 8C:
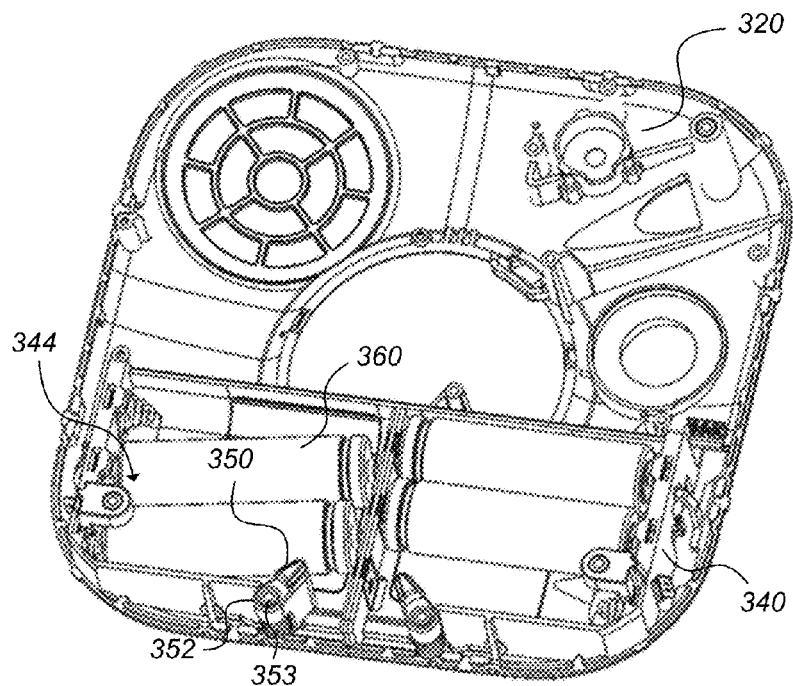
Figure 9:
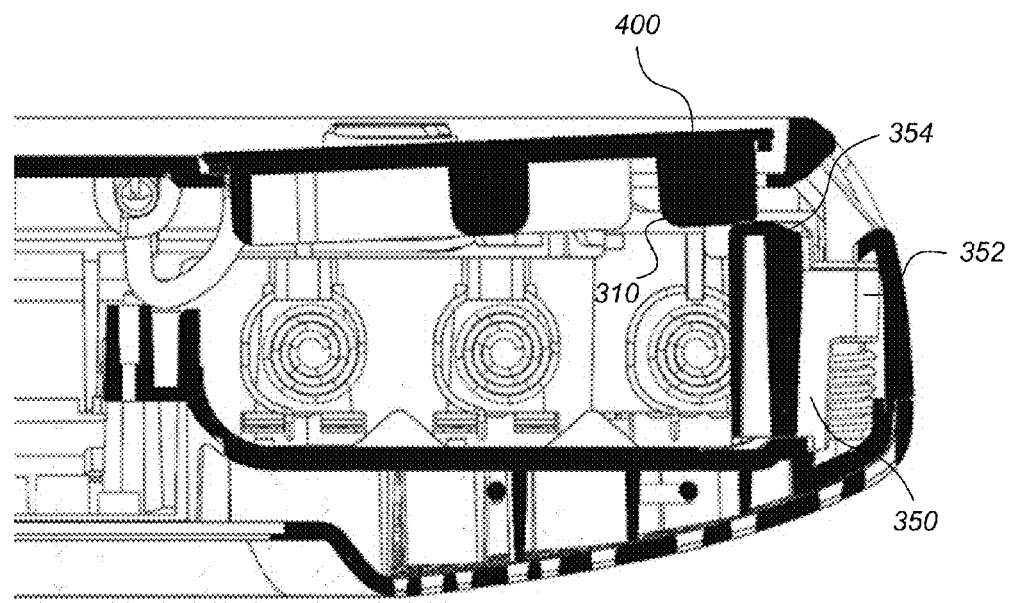
FIG. 9 illustrates the access door block functioning to prevent closure of the battery access door when one or more batteries are absent from the battery compartment.

FIGS. 8A-9 illustrate the battery compartment 340 in greater detail and specifically an access door block 350 that is positioned adjacent the battery compartment 340 and operable to prevent closure of the battery access door 400 when less than a full complement of batteries is positioned within the battery compartment. Stated differently, the access door block 350 is configured to prevent closure of the battery access door 400 when one or more batteries are missing or not positioned within the battery compartment 340. The access door block 350 prevents closure of the battery access door 400 by pivoting into an interior space of the battery compartment 340 when less than the full complement of batteries is positioned within the battery compartment. When positioned in the interior space of the battery compartment 340, the access door block 350 contacts one or more of the vanes 310 positioned on the battery access door 400 to prevent closure of the battery access door. When a full complement of batteries is positioned within the battery compartment 340, the batteries function cooperatively to prevent the access door block 350 from pivoting into the interior space of the battery compartment 340.

FIG. 8A illustrates the access door block 350 pivoted into the interior space 342 of the battery compartment 340. The battery compartment 340 includes a casing that houses the batteries. The casing may include a plurality of chambers or slots for holding a plurality of batteries, with each chamber including a positive terminal and a negative terminal. The casing may also include a divider 346 that divides left and right battery chambers or slots. The casing further includes ribs 344 that are positioned on one end of the chamber (e.g., adjacent the negative terminal) and that function to maintain the one end of the battery within the chamber and adjacent the corresponding terminal. The ribs 344 may aid in defining the chambers within the casing.

As shown in FIG. 8A, when one or more batteries are absent from the battery compartment (i.e., the battery compartment includes less than a full complement of batteries), the access door block 350 is pivoted into the inter space 342 of the battery compartment 340. The access door block 350 is positioned about and pivotally coupled with a central boss 353 that is attached to the main chassis 320. A spring (not shown) is positioned around the central boss 353 and coupled with the main chassis 320 and the access door block 350. The spring biases the access door block 350 to pivot into the interior space 342 when one or more batteries are not positioned within the battery compartment 340. As shown in FIG. 8C, the spring force exerted on the access door block 350 is sufficient to deflect or push an end of one or more batteries 360 out of its chamber when the battery or batteries 360 are positioned adjacent the access door block 350 and one or more batteries 360 are missing from the battery compartment 340. The other end of the battery or batteries 360 may remain positioned within the chamber due to contact with or interference from the ribs 344. The configuration of the access door block 350 ensures that the access door block 350 will pivot into the interior space 342 when one or more batteries are not present within the battery compartment 340.

FIG. 8B illustrates that when all the batteries 360 are positioned within the battery compartment 340, the batteries function cooperatively to prevent the access door block 350 from pivoting into the interior space 342. Specifically, as illustrated in FIG. 8B, when three batteries 360 are positioned in the left three chambers of battery compartment 340, a force exerted on a battery 360 that is adjacent the access door block 350 is transferred to the other two batteries 360 and to the distal exterior wall of the casing of battery compartment 340, which prevents the access door block 350 from displacing the batteries 360 from their respective chambers and pivoting into the interior space 342. When three batteries 360 are likewise positioned in the right three chambers of the battery compartment 340, these batteries likewise function cooperatively to prevent the access door block 350 from pivoting into the interior space 342. If a single battery is removed from one of the left chambers or right chambers, however, the respective access door block 350 will pivot into the interior space 342 as described above. It should be realized that the battery compartment of FIGS. 8A-8C is illustrative only and that the battery compartment could include more or fewer batteries and/or chambers as desired.

FIG. 9 illustrates the access door block 350 functioning to prevent closure of the battery access door 400. Specifically, the access door block 350 includes a raised distal end 354 that contacts one of the vanes 310 of the battery access door 400 when the access door block 350 is positioned in the interior space 342 of the battery compartment 340. Contact between the raised distal end 354 of the access door block 350 and the vane 310 of the battery compartment 340 prevents the battery access door 400 from being closed. When the access door block 350 is pivoted out of the battery compartment's interior space 342, the raised distal end 354 of the access door block 350 is positioned so as not to contact any of the vanes 310 of the battery access 400, which allows closure of the battery access door 400.

Figure 10:
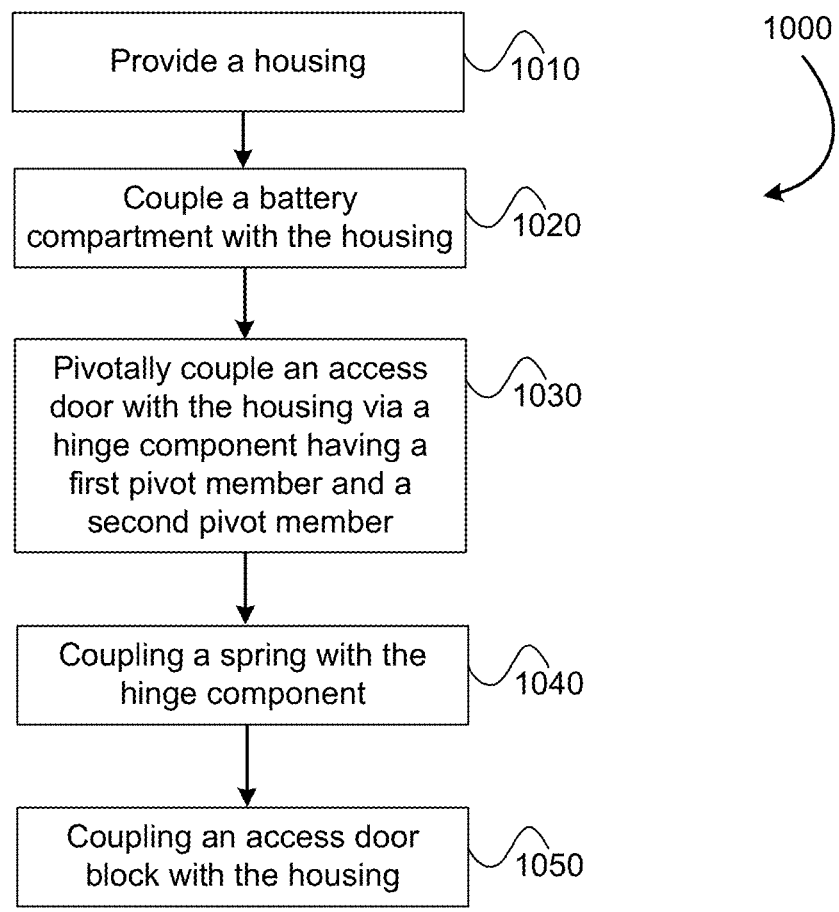
FIG. 10 illustrates a method for configuring a hazard detector.

Referring now to FIG. 10, illustrated is a method 1000 for configuring a hazard detector. At block 1010, a housing is provided. The housing includes an interior region within which components of the hazard detector are contained and includes a plurality of openings through which air flows so as to be accessible to a hazard sensor positioned within the interior region of the housing. At block 1020, a battery compartment is coupled with the housing. As described above, the battery compartment may be positioned on a front plate or main chassis that is coupled with the housing and/or a cover that is coupled with the housing. The battery compartment is configured for housing one or more batteries that provide a main power or supplemental power to one or more components of the hazard detector. At block 1030, a battery compartment access door is pivotally coupled with a bottom surface of the housing via a hinge component having a first pivot member and a second pivot member. The access door is pivotably closable over the battery compartment to secure the one or more batteries within the battery compartment and is pivotably openable to allow user access to the one or more batteries positioned within the battery compartment. The first pivot member enables the access door to pivot along a first pivot path by a first pivot amount and the second pivot member enables the access door to pivot along a second pivot path by a second pivot amount. A cumulative total of the first pivot amount and the second pivot amount is substantially greater than either pivot amount in isolation.

In some embodiments, the method optionally includes coupling a spring with the hinge component (block 1040), where the spring is configured to bias the access door toward the open position so that operation of a release member of the access door effects automatic opening of the access door. In some embodiments, the spring is a torsional spring. In some embodiments, the method optionally includes coupling an access door block with the housing (block 1050) so that the access door block pivots into the battery compartment when less than a full complement of batteries is positioned within the battery compartment. When a full complement of batteries is positioned within the battery compartment, the batteries function cooperatively to prevent the access door block from pivoting into the battery compartment. In some embodiments, the hinge component may be operable with, or include, a stop that limits the pivot of the access door via the first pivot member to the first pivot amount. In some embodiments, the access door may include one or more vanes that direct airflow from an exterior of the hazard detector to the interiorly positioned hazard sensor.

Having described several embodiments, it will be recognized by those of skill in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the device" includes reference to one or more devices and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. An electronic device comprising:
    a housing having an interior region within which components of the electronic device are contained;
    a battery compartment configured for housing one or more batteries that provide a main power or supplemental power to one or more components of the electronic device; and
    a battery compartment access door that is pivotably coupled with a bottom surface of the housing, the access door being pivotably closable over the battery compartment to secure the one or more batteries within the battery compartment and the access door being pivotably openable to allow user access to the one or more batteries positioned within the battery compartment such as for inspection or replacement, the access door comprising:
    a release member that releasably secures the access door in a closed position relative to the housing and that is releasable to allow the access door to be pivoted open;
    a first hinge member that pivotably couples the access door to the housing, the first hinge member enabling the access door to pivot along a first pivot path by a first pivot amount; and
    a second hinge member that enables the access door to pivot along a second pivot path by a second pivot amount, wherein a cumulative total of the first pivot amount and the second pivot amount is substantially greater than either pivot amount in isolation.

2. The electronic device of claim 1, further comprising a spring that is coupled with the first hinge member, the spring being configured to bias the access door toward the open position such that operation of the release member effects automatic opening of the access door.

3. The electronic device of claim 2, wherein the spring is a torsional spring.

4. The electronic device of claim 1, further comprising an access door block that prevents closing of the access door when less than a full complement of batteries are positioned within the battery compartment.

5. The electronic device of claim 4, wherein the access door block is configured to pivot into the battery compartment when less than the full complement of batteries is positioned within the battery compartment, and wherein when the full complement of batteries is positioned within the battery compartment, the batteries function cooperatively to prevent the access door block from pivoting into the battery compartment.

6. The electronic device of claim 1, further comprising a stop that functions operationally with the first hinge member to limit the pivot of the access door to the first pivot amount.

7. The electronic device of claim 1, wherein the first pivot amount is between about 80o and 100o and wherein the second pivot amount is between about 130o and 180o.

8. The electronic device of claim 1, wherein the battery compartment access door includes a recessed lip having a strip of material that presses into contact with the housing when closed the battery compartment access door is closed to seal any gaps between the battery compartment access door and the housing.

9. The electronic device of claim 1, wherein the electronic device is a hazard detector that is configured to detect a hazard within a structure and alert one or more occupants of the hazard.

10. An electronic device comprising:
    a battery compartment that houses one or more batteries that provide a main power or supplemental power to the electronic device; and
    a multi-hinged access door that is pivotably closable over the battery compartment to secure the one or more batteries within the battery compartment and that is pivotably openable to allow user access to the one or more batteries positioned within the battery compartment, the multi-hinged access door being configured to pivot about a first pivot point by a first pivot amount and being further configured to pivot about at least one additional pivot point by a second pivot amount, wherein a cumulative total of the first pivot amount and the second pivot amount is substantially greater than either pivot amount in isolation.

11. The electronic device of claim 10, further comprising a spring that is coupled with the multi-hinged access door to bias the multi-hinged access door to pivot open about the first pivot point.

12. The electronic device of claim 11, wherein the spring is a torsional spring.

13. The electronic device of claim 11, wherein the electronic device is free of an additional spring that biases the multi-hinged access door to pivot open about the at least one additional pivot point.

14. The electronic device of claim 10, further comprising a door block that prevents closing of the multi-hinged access door when less than a full complement of batteries is positioned within the battery compartment.

15. The electronic device of claim 14, wherein the door block is configured to pivot into the battery compartment when less than the full complement of batteries is positioned within the battery compartment, and wherein the batteries function cooperatively to prevent the door block from pivoting into the battery compartment when the full complement of batteries is positioned within the battery compartment.

16. The electronic device of claim 10, wherein the multi-hinged access door is positioned on a flat surface of a housing of the electronic device, and wherein the multi-hinged access door is conformal with the flat surface of the housing so that when the multi-hinged access door is closed, the multi-hinged access door does not protrude outward from the flat surface of the housing.

17. The electronic device of claim 16, further comprising a release member that releasably secures the multi-hinged access door in a closed position and that is releasable to allow the multi-hinged access door to be pivoted open, the releasable member being recessed into the multi-hinged access door so that the releasable member does not protrude outward from the multi-hinged access door and the flat surface of the housing.

18. The electronic device of claim 17, wherein the releasable member is slidably mounted to the multi-hinged access door in a manner that prevents air flow through the releasable member mounting into an interior of the battery compartment.

19. The electronic device of claim 10, further comprising a first hinge member that pivotably couples the multi-hinged access door to the housing in a manner that allows the multi-hinged access door to pivot about the first pivot point by the first pivot amount.

20. The electronic device of claim 19, further comprising a second hinge member that enables the multi-hinged access door to pivot about the at least one additional pivot point by the second pivot amount.

\* \* \* \* \*